(12) United States Patent
Tsuchiya

(10) Patent No.: US 8,217,440 B2
(45) Date of Patent: Jul. 10, 2012

(54) SEMICONDUCTOR DEVICE AND METHOD OF FABRICATING THE SAME

(75) Inventor: Yoshinori Tsuchiya, Clifton Park, NY (US)

(73) Assignee: Kabushiki Kaihsa Toshiba, Tokyo (JP)

( * ) Notice: Subject to any disclaimer, the term of this patent is extended or adjusted under 35 U.S.C. 154(b) by 109 days.

(21) Appl. No.: 12/881,374

(22) Filed: Sep. 14, 2010

(65) Prior Publication Data

US 2012/0061773 A1    Mar. 15, 2012

(51) Int. Cl.
*H01L 29/94* (2006.01)

(52) U.S. Cl. ........ 257/310; 257/288; 257/405; 257/406; 257/610; 257/611; 257/E21.409

(58) Field of Classification Search ................... 257/288, 257/405, 406, 610, 611, 310
See application file for complete search history.

(56) References Cited

U.S. PATENT DOCUMENTS

| | | | | |
|---|---|---|---|---|
| 2009/0242970 A1* | 10/2009 | Shimizu et al. | ............... | 257/326 |
| 2009/0263950 A1* | 10/2009 | Koyama et al. | ............... | 438/287 |
| 2011/0037131 A1* | 2/2011 | Mueller et al. | ............... | 257/410 |

FOREIGN PATENT DOCUMENTS

| | | |
|---|---|---|
| JP | 2006-019351 | 1/2006 |
| JP | 2006-093670 | 4/2006 |
| WO | 2007040057 | 4/2007 |

OTHER PUBLICATIONS

Xiong et al, Impact of Incorporated Al on the TiN/HfO2 Interface Effective Work Function, Journal of Applied Physics 104, 2008.
Sen et al, Effects of Aluminum Incorporation on Hafnium Oxide Film Using Plasma Immersion Ion Implantation, Microelectronics Reliability 48, 1765-1768, 2008.
Inoue et al, Fluorine Incorporation into HfSiON Dielectric for Vth Control and Its Impact on Reliability for Poly-Si Gate pFET, IEEE, ,2005.

* cited by examiner

*Primary Examiner* — Kenneth Parker
*Assistant Examiner* — Jose R Diaz
(74) *Attorney, Agent, or Firm* — Turocy & Watson, LLP

(57) ABSTRACT

MOSFETs and methods of making MOSFETs are provided. According to one embodiment, a semiconductor device includes a substrate and a Metal-Oxide-Semiconductor (MOS) transistor that includes a semiconductor region formed on the substrate, a source region and drain region formed in the semiconductor region that are separated from each other, a channel region formed in the semiconductor region that separates the source region and the drain region, an interfacial oxide layer (IL) formed on the channel region into which at least one element disparate from Si, O, or N is incorporated at a peak concentration greater than $1 \times 10^{19}$ atoms/cm$^2$, and a high-k dielectric layer formed on the interfacial oxide layer having a high-k/IL interface at a depth substantially adjacent to the IL. In addition, at least one depth of peak density of the incorporated element(s) is located substantially below the high-k/IL interface.

13 Claims, 15 Drawing Sheets

SEMICONDUCTOR DEVICE AND METHOD OF FABRICATING THE SAME

FIELD

Embodiments described herein relate generally to Metal-Oxide-Semiconductor Field Effect Transistors (MOSFETs) and methods for fabricating MOSFETs.

BACKGROUND

Silicon large-scale integrated circuits, among other device technologies, are increasing in use in order to provide support for the advanced information society of the future. To produce an integrated circuit with highly sophisticated functions, semiconductor devices that yield high performance, such as MOSFETs or CMOSFETs (Complementary MOSFETs), can be utilized to constitute an integrated circuit.

In the design of a MOSFET, CMOSFET, and/or similar devices, formation of gate electrodes having respective optimum threshold voltage(s) according to factors such as device structure, conductivity types, operation voltage, etc., can complicate the production process of such devices. This added complication can, in turn, increase the production costs for such devices and/or introduce a loss of efficiency or other such effects. Accordingly, it would be desirable to implement techniques for controlling the threshold voltage of each electrode corresponding to a MOSFET, CMOSFET, or the like through simple, easily implementable procedures.

DETAILED DESCRIPTION

Figure 1:
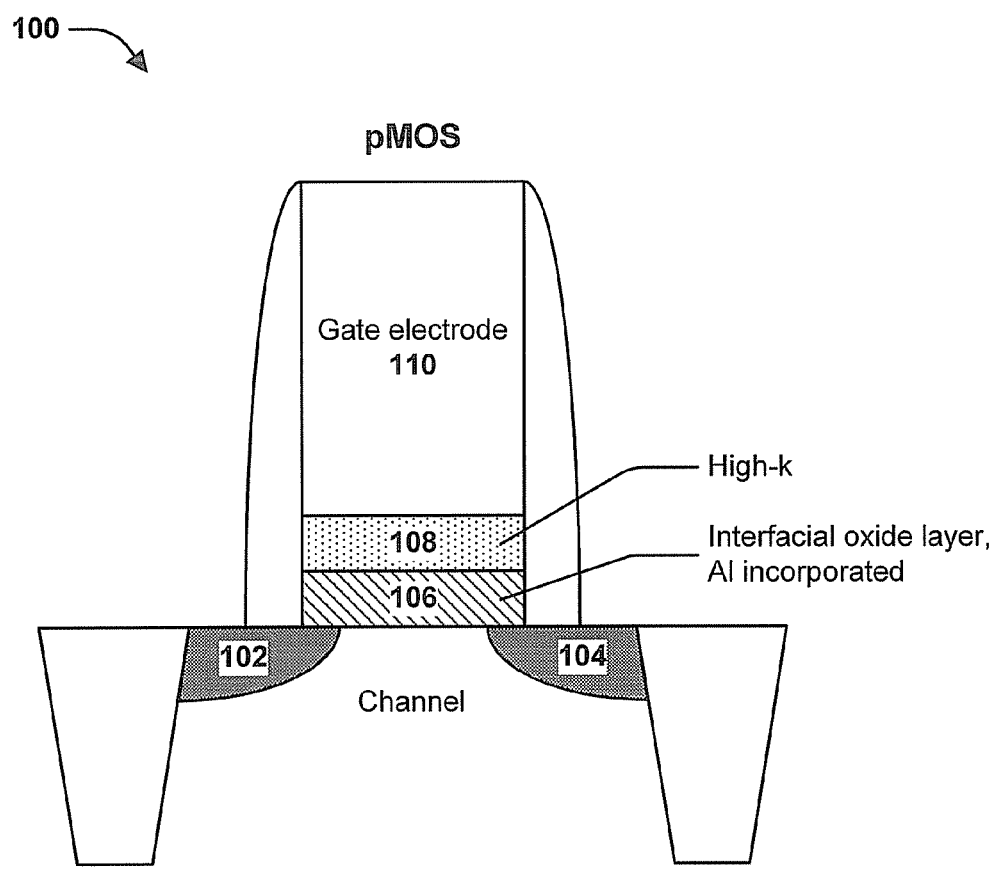
FIG. 1 is a cross-sectional illustration of portions of an example MOSFET in accordance with an embodiment of the subject innovation.

The subject innovation provides respective semiconductor devices having third elements, which are not the main components of the high-k and/or interfacial oxide layers, doped in the gate dielectric and/or interfacial oxide layer. In various embodiments, one of the peak density depth regions is located channel-side below the high-k/interfacial oxide interface. In various other embodiments, an additional layer is introduced into a semiconductor device above or at the high-k/interfacial oxide interface, thereby introducing two depths of peak doping density. In further embodiments, methods of fabricating semiconductor devices according to at least the above are provided.

According to one embodiment, a semiconductor device includes a substrate and a Metal-Oxide-Semiconductor (MOS) transistor. The MOS transistor includes a semiconductor region formed on the substrate, a source region and drain region formed in the semiconductor region that are separated from each other, a channel region formed in the semiconductor region that separates the source region and the drain region, an interfacial oxide layer (IL) formed on the channel region into which at least one element disparate from Si, O, or N is incorporated at a peak concentration greater than $1 \times 10^{19}$ atoms/cm$^2$, and a high-k dielectric layer formed on the interfacial oxide layer having a high-k/IL interface at a depth substantially adjacent to the IL. Within the semiconductor device, at least one depth of peak density of the element(s) incorporated into the IL is located substantially below the high-k/IL interface. The MOS transistor can be a p-channel MOS or pMOS transistor, in which case elements that can be incorporated into the IL include Al and Ge. Additionally or alternatively, the MOS transistor can be an n-channel MOS or nMOS transistor, in which case elements that can be incorporated into the IL include La, Y, Mg, Lu, Gd, Ba, and Ti.

According to another embodiment, a semiconductor device includes a substrate and a MOS transistor. The MOS transistor includes a semiconductor region formed on the substrate, a source region and drain region formed in the semiconductor region that are separated from each other, a channel region formed in the semiconductor region that separates the source region and the drain region, an interfacial oxide layer (IL) formed on the channel region into which at least one element disparate from Si, O, or N is incorporated at a peak concentration greater than $1 \times 10^{19}$ atoms/cm$^2$, a high-k dielectric layer formed on the interfacial oxide layer having a high-k/IL interface at a depth substantially adjacent to the IL, and a supplemental layer adjacent to the high-k dielectric layer that is substantially composed of the element(s) incorporated into the IL or at least one oxide of said element(s). Within the semiconductor device, at least a first depth of peak density of the element(s) incorporated into the IL is located substantially below the high-k/IL interface, and at least a second depth of peak density of the element(s) incorporated into the IL is located at a depth corresponding to the supplemental layer. The supplemental layer can be located at a depth corresponding to the high-k/IL interface and/or a depth located substantially above the high-k dielectric layer. In addition, the MOS transistor can be a p-channel MOS or pMOS transistor, in which case elements that can be incorporated into the IL and/or the supplemental layer include Al and Ge. Additionally or alternatively, the MOS transistor can be an n-channel MOS or nMOS transistor, in which case elements that can be incorporated into the IL and/or the supplemental layer include La, Y, Mg, Lu, Gd, Ba, and Ti.

According to a further embodiment, a method of fabricating a semiconductor device includes producing a substrate, forming a channel region in the substrate, forming an IL on the channel region, doping at least one element that is disparate from Si, O, or N into the channel region and/or the IL, and depositing a high-k dielectric upon the IL. The at least one element can be doped into the IL between formation of the IL and high-k deposition. Alternatively, the at least one element can be doped into the channel region prior to IL formation. In the event that the at least one element is doped into the channel region, an anneal can be performed between IL formation and high-k deposition. Doping can in some cases be conducted such that a peak position of the at least one element is greater than 1A from a surface of the region into which the at least one element is doped. Further, doping can in some cases be conducted via ion implantation (e.g., at an energy level substantially less than 10 keV).

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the disclosed information when considered in conjunction with the drawings.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices may be shown in block diagram form in order to facilitate describing the claimed subject matter.

Referring first to FIG. 1, a cross-sectional illustration of an example semiconductor device 100 is provided in accordance with an embodiment. As shown in FIG. 1, semiconductor device 100 can include a substrate and a p-channel MOS transistor or MOSFET, also referred to herein as a pMOS transistor. The pMOS transistor includes an n-type semiconductor region formed on the substrate and a source region 102 and drain region 104, wherein the source and drain regions are formed in the n-type semiconductor region and are separated from each other. In addition, the pMOS transistor can include a channel region formed in the n-type semiconductor region that separates the source region 102 and drain region 104. The pMOS transistor can further include an interfacial oxide layer (IL) 106 situated upon the channel and located between the gate and source/drain regions. In addition, the pMOS transistor can include a gate or high-k dielectric 108 having a high dielectric constant k, upon which a gate electrode 110 can be placed.

In a specific, non-limiting example, IL 106 can contain a channel material (e.g., Si, Ge, C, etc.). Additionally, oxygen, and optionally nitrogen, can be incorporated. In another non-limiting example, high-k dielectric 108 can exhibit a thickness between approximately 0.1 nm and approximately 25 nm. Further, high-k dielectric 108 can be constructed using a variety of metal-Si materials and/or any other suitable material(s) having a high dielectric constant. For example, materials that can be utilized for high-k dielectric 108 can include compositions having the following chemical formulae: $Hf_xSi_{1-x}O_2$, $Hf_xSi_{1-x}ON$, $Zr_xSi_{1-x}O_2$, $Zr_xSi_{1-x}ON$, $La_xSi_{1-x}O_2$, $La_xSi_{1-x}ON$, $Gd_xSi_{1-x}O_2$, $Gd_xSi_{1-x}ON$, HfZrSiO, HfZrSiON, HfLaSiO, and HfGdSiO, where x is between 0 and 1. It should be appreciated, however, that the preceding list is provided merely by way of example and that other compositions could also be utilized. In a further non-limiting example, gate electrode 110 can be formed using a metal or metallic alloy. Specific examples of compositions that can be utilized for gate electrode 110 include metals such as Ti, Hf, Ta, W, Al, Ru, Pt, Re, Cu, Ni, Pd, Ir, and/or Mo; nitrides and carbides such as TiN, TaN, TiC, TaC, WN, WC, and/or HfN; conductive oxides such as RuOx and/or ReOx; metal-metal-alloys such as Ti—Al, Hf—Al, Ta—Al, and/or TaAlN; multi-stacked structures of the preceding compositions, such as TiN/W, TiN/Ti—Al, Ta/TiN/Ti—Al, or the like. According to an embodiment, one or more of the above compositions can be stacked with a Si and metal-silicide, such as $NiSi_x$, $PtSi_x$, $PdSi_x$, $CoSi_x$, $TiSi_x$, $WSi_x$, etc. It should be appreciated, however, that the preceding list is provided by way of example and that other compositions could be utilized for gate electrode 110.

With respect to the construction of semiconductor device 100, as well as various other semiconductor devices as illustrated and described herein, it can be appreciated that the formation of gate electrodes having the respective optimum threshold voltages according to device structure, conductivity types, operation voltage, etc., can in some cases complicate the production process of a related CMOSFET and/or other semiconductor device, thereby increasing the production costs and/or introducing other negative effects. Accordingly, it can be appreciated that methods for controlling the threshold voltage of each electrode through simple procedures are desirable. Thus, according to an embodiment, third elements, which are not the main components of the high-k and interfacial oxide layers in a semiconductor device, can be doped in the gate dielectric and/or interfacial oxide layer. In one example, at least one resulting peak density depth region can be located below the high-k/interfacial oxide interface, channel-side. By constructing a semiconductor device in this manner, it can be appreciated that a work function can be easily modulated via a smaller amount of dosing compared to conventional methods, resulting in improvement of device performance.

With respect to the above and the embodiments that follow, it can be appreciated that while FIG. 1 and the respective other illustrations provided herein show examples of semiconductor devices for which the embodiments can be implemented, the embodiments described herein can also be applicable for novel channel devices (e.g., SiGe, SiC, SiGeC, III-V materials, etc.), novel device structures (e.g., Si on insulator (SOI), 3-dimensional transistors (e.g., finFET, verticalFET, nanowire, nanotube, . . . ), etc.), and/or any other suitable device type(s). In addition, it can be appreciated that incorporation of Al (and/or Ge or any other suitable element(s)) can be utilized for high-threshold voltage ($V_t$) nMOS in addition to, or in place of, the pMOS transistor illustrated in relation to semiconductor device 100.

Figure 2:
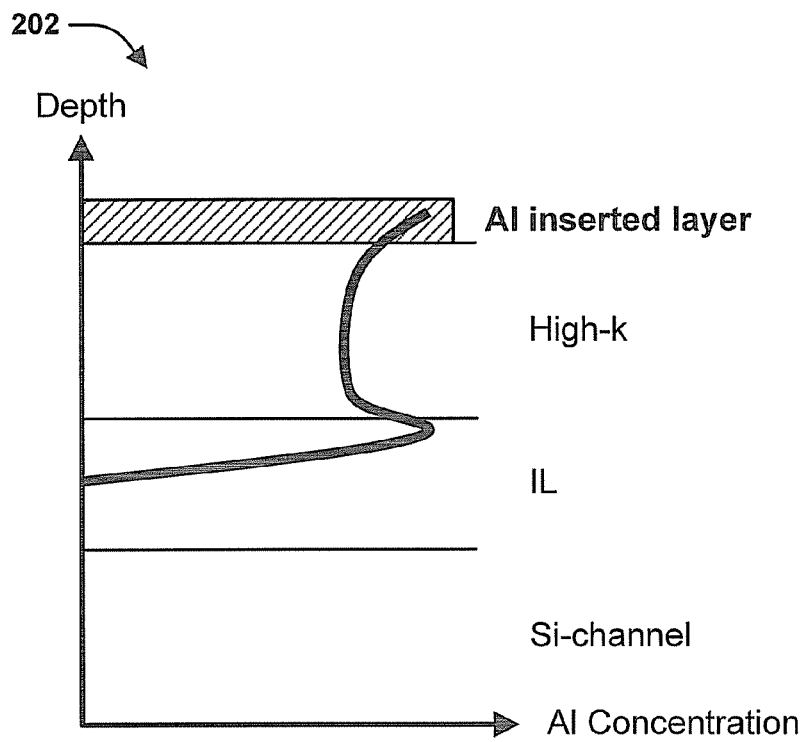
FIGS. 2 to 3 illustrate depth profiles of respective example transistor designs in accordance with various embodiments of the subject innovation.
Figure 2:
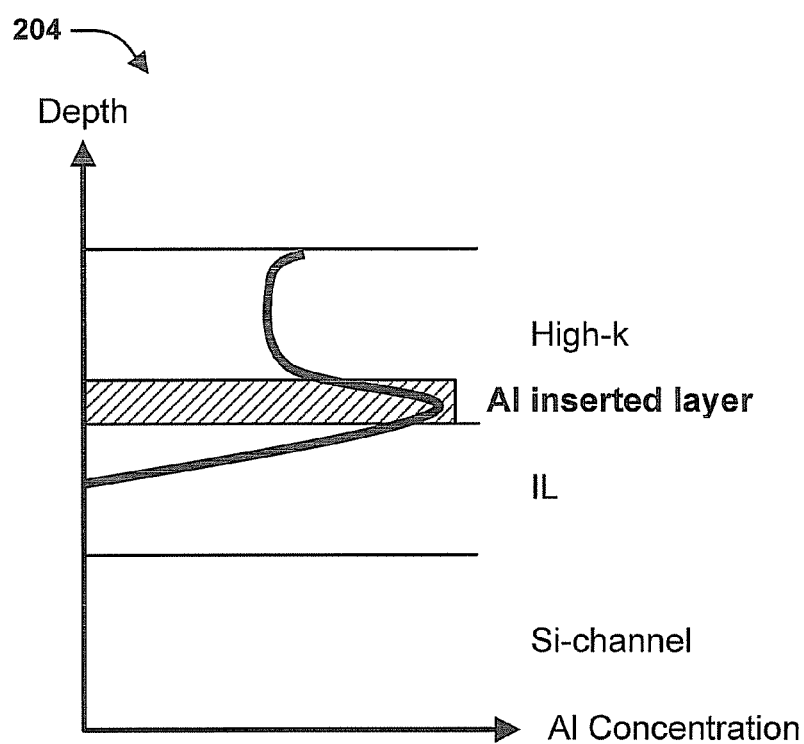
Figure 3:
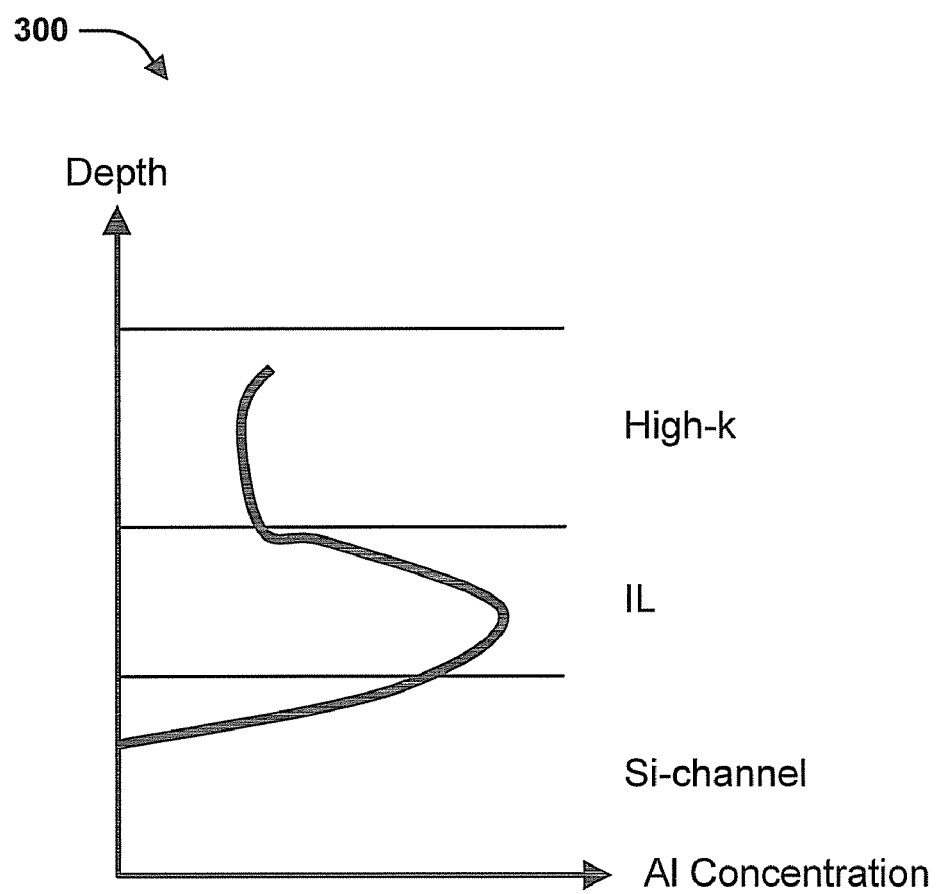

According to an embodiment, enhanced threshold voltage modulation for semiconductor device 100 can be achieved by introducing one or more third elements (e.g., an element not utilized as the main component(s) of IL 106 or high-k dielectric 108) to IL 106 and/or high-k dielectric 108. By way of example, as shown in FIG. 1, Al can be incorporated into IL 106, thereby effecting a positive threshold voltage shift for semiconductor device 100. This technique is in contrast to conventional semiconductor fabrication techniques, wherein a layer of Al and/or another suitable material is inserted at one or more depths within the semiconductor device. For example, as shown by FIG. 2, graph 202 shows the depth profile of the density of Al within a semiconductor device having an Al inserted layer on the high-k layer, and graph 204 illustrates the depth profile of the density of Al within a semiconductor device having an Al inserted layer at the high-k/IL layer. Contrastingly, by incorporating one or more third elements into IL 106 and/or high-k dielectric 108 of semiconductor device 100, a depth profile of the density of Al within semiconductor device 100 can be substantially similar to that illustrated by graph 300 in FIG. 3. As shown by graph 300, the Al peak density depth region of semiconductor device 100 can be located below the high-k interfacial oxide interface and on the Si channel side, in contrast to the conventional approaches illustrated by graphs 202 and 204.

Referring again to FIG. 1, and as noted above, Al in one embodiment can be incorporated at least in IL 106. In one example, Al in IL 106 can be utilized to modulate the threshold voltage $V_t$ of semiconductor device 100, which corresponds to a positive work function modulation depending on the concentration of Al. According to another embodiment, the peak concentration of Al in IL 106 can be approximately $10^{19}$ atoms/cm$^2$ to approximately $10^{22}$ atoms/cm$^2$.

While semiconductor device 100 illustrates a MOS transistor having Al incorporated in the interfacial oxide layer, it should be appreciated that other implementations can be utilized. For example, Al can be incorporated in the channel or high-k dielectric 108 of semiconductor device 100 in addition to or in place of IL 106. Further, other elements, such as Ge or the like, can be incorporated in addition to, or in place of, Al.

Figure 4:
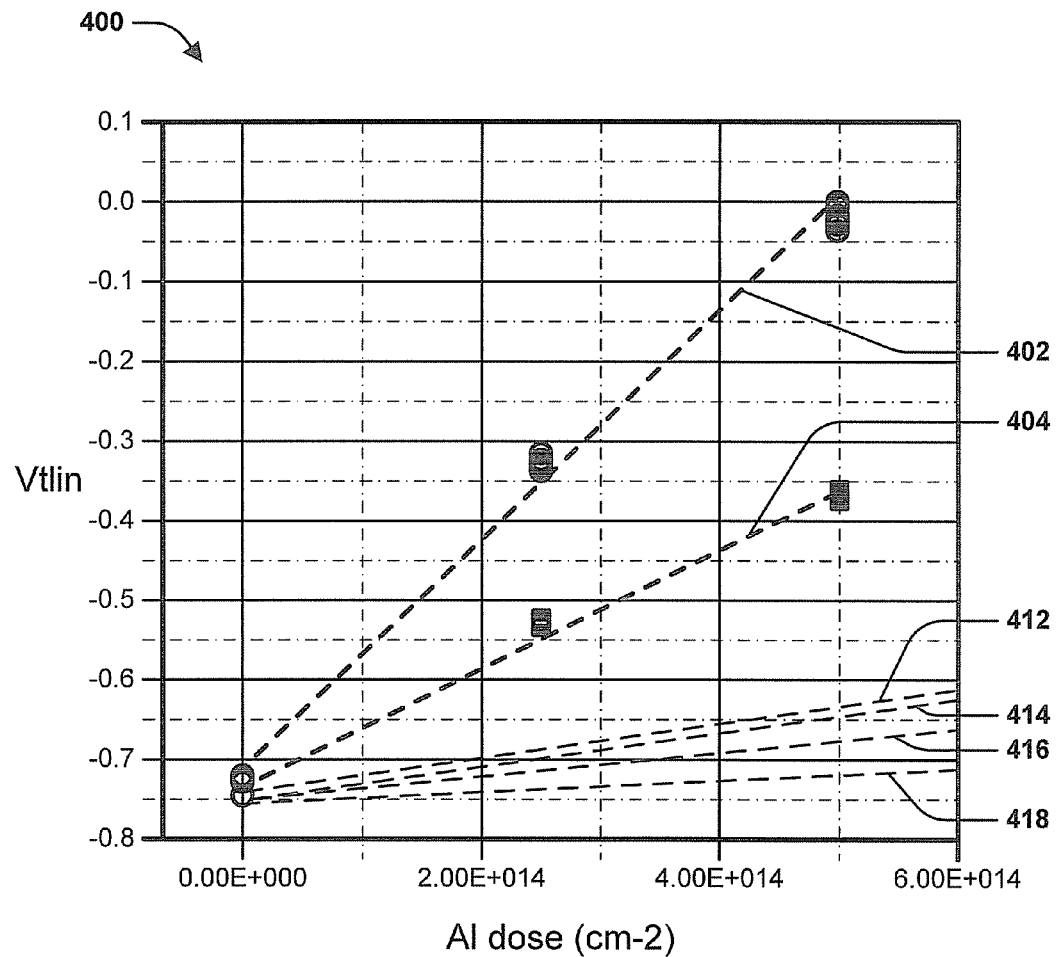
FIGS. 4 to 5 illustrate threshold voltage modulation data for respective example transistor designs in accordance with various embodiments of the subject innovation.

According to an embodiment, graph 400 in FIG. 4 illustrates example data showing the relationship between Al concentration in a semiconductor device according to various incorporation methods and the baseline threshold voltage $V_{tlin}$ of the semiconductor device. It should be appreciated, however, that while graph 400 shows data for the specific example case of Al incorporation, similar results could be achieved in the case of Ge incorporation and/or the incorporation of other suitable materials.

With further reference to graph 400, line 402 represents threshold voltage data obtained via Al ion implantation (I/I) at a substantially high energy and line 404 represents threshold voltage data obtained via Al ion implantation at a substantially low energy. In the case of both lines 402 and 404, Al ions are ion implanted to the interfacial oxide layer of a semiconductor device prior to high-k deposition. Further, Al is incorporated at a dose range of $10^{13}$ to $10^{16}$ ions/cm$^2$ and an energy range of less than 1 keV. It should be appreciated, however, that the dose and energy utilized for implantation can in some cases depend on element species.

In both cases of Al ion implantation to the interfacial oxide layer as illustrated by lines 402 and 404, it can be observed from graph 400 that a substantially larger amount of threshold voltage modulation can be achieved at a comparable Al density to conventional threshold voltage modulation approaches, illustrated by lines 412 through 418. In particular, line 412 illustrates threshold voltage modulation results obtained via fluorine ion implantation to the channel, line 414 illustrates threshold voltage modulation results based on Al layer insertion at the high-k/IL interface (e.g., as shown by graph 204), line 416 illustrates threshold voltage modulation results based on Al ion implantation through the metal gate and high-k layers, and line 418 illustrates threshold voltage modulation results using Al layer insertion at the top of the high-k layer (e.g., as shown by graph 202).

Figure 5:
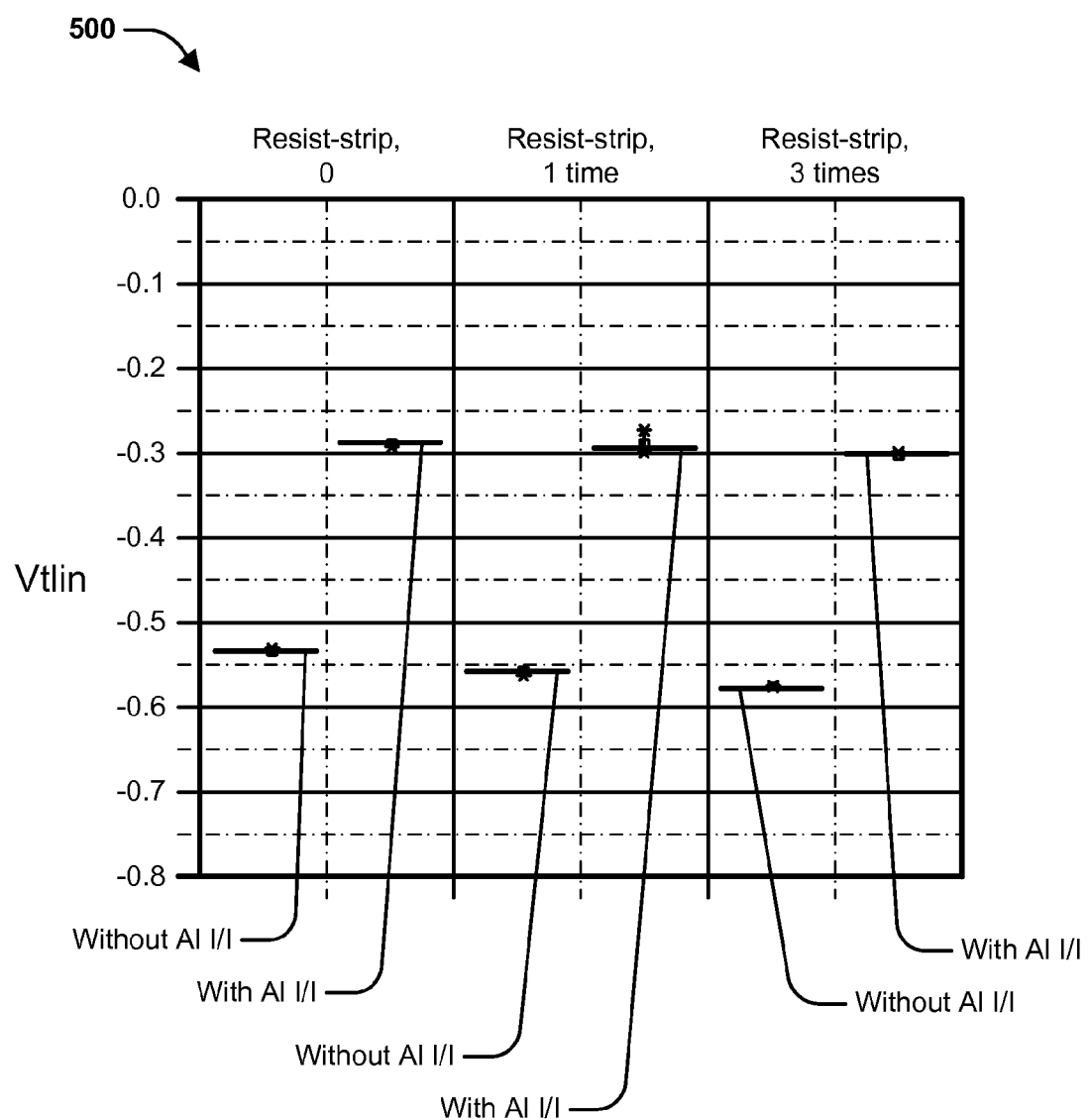

According to an embodiment, a pMOS transistor (e.g., such as that illustrated by semiconductor device 100 in FIG. 1) having Al and/or another suitable element incorporated via ion implantation can suppress $V_{tlin}$ fluctuation via resist-strip reworking and/or other suitable techniques. For example, diagram 500 in FIG. 5 illustrates a comparison of $V_{tlin}$ for cases with and without Al incorporation into the IL for various resist-strip wet processing iterations. In the examples illustrated by diagram 500, resist-strip wet processing is performed before the Al I/I step to simulate the CMOS integration process flow. As diagram 500 illustrates, although the $V_{tlin}$ values shift negatively in the cases without Al I/I to the IL, a $V_{tlin}$ that is substantially stable against wet etching can be realized by adding Al. It can be appreciated that this benefit can be supplemental to other benefits described herein, such as positive $V_{tlin}$ shifts. While the above example is illustrated for the specific case of Al incorporation, however, it should be appreciated that this improvement of $V_{tlin}$ stability can also be achieved via the incorporation of any other suitable element(s) as generally described herein.

Figure 6:
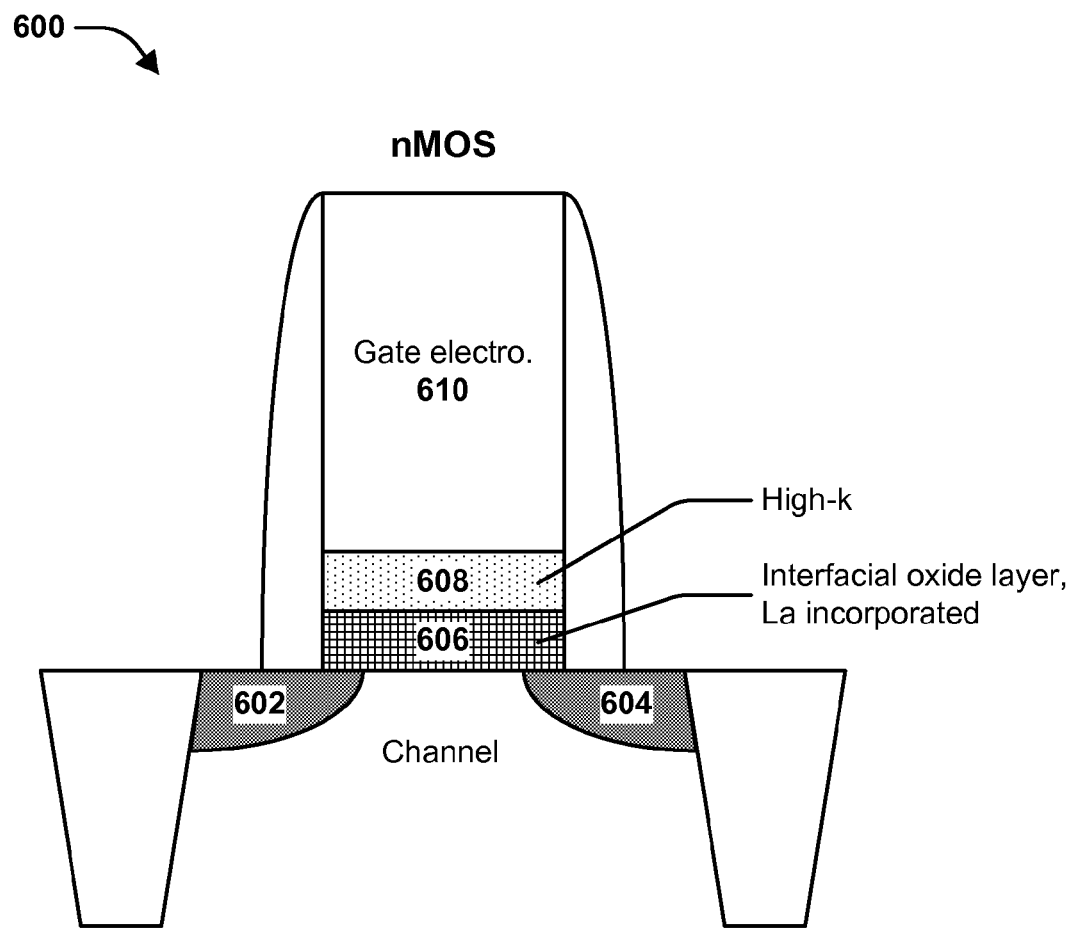
FIGS. 6 to 7 are additional cross-sectional illustrations of portions of example MOSFETs in accordance with respective embodiments of the subject innovation.

Turning next to FIG. 6, a cross-sectional illustration of an example semiconductor device 600 is provided in accordance with an embodiment. As shown in FIG. 6, semiconductor device 600 can include a substrate and an n-channel MOS transistor or MOSFET, also referred to herein as an nMOS transistor. The nMOS transistor includes a p-type semiconductor region formed on the substrate and a source region 602 and drain region 604, wherein the source and drain regions are formed in the p-type semiconductor region and are separated from each other. In addition, the nMOS transistor can include a channel region formed in the p-type semiconductor region that separates the source region 602 and the drain region 604. The nMOS transistor can further include an interfacial oxide layer (IL) 606 situated upon the channel region and located between the gate and source/drain regions. In addition, the nMOS transistor can include a gate or high-k dielectric 608 having a high dielectric constant k, upon which a gate electrode 610 can be placed.

According to an embodiment, IL 606, high-k dielectric 608, and gate electrode 610 can be constructed to exhibit similar properties and/or to utilize similar compositions to those described above with respect to semiconductor device 100. More particularly, and by way of non-limiting example, IL 606 can contain a channel material (e.g., Si, Ge, C, etc.), to which oxygen, and optionally nitrogen, can be incorporated. In another non-limiting example, high-k dielectric 608 can exhibit a thickness between approximately 0.1 nm and approximately 25 nm. Further, high-k dielectric 608 can be constructed using a variety of metal-Si materials and/or any other suitable material(s) having a high dielectric constant. For example, materials that can be utilized for high-k dielectric 608 can include compositions having the following chemical formulae: $Hf_xSi_{1-x}O_2$, $Hf_xSi_{1-x}ON$, $Zr_xSi_{1-x}O_2$, $Zr_xSi_{1-x}ON$, $La_xSi_{1-x}O_2$, $La_xSi_{1-x}ON$, $Gd_xSi_{1-x}O_2$, $Gd_xSi_{1-x}ON$, HfZrSiO, HfZrSiON, HfLaSiO, and HfGdSiO, where x is between 0 and 1. It should be appreciated, however, that the preceding list is provided merely by way of example and that other compositions could also be utilized. In a further non-limiting example, gate electrode 610 can be formed using a metal or metallic alloy. Specific examples of compositions that can be utilized for gate electrode 610 include metals such as Ti, Hf, Ta, W, Al, Ru, Pt, Re, Cu, Ni, Pd, Ir, and/or Mo; nitrides and carbides such as TiN, TaN, TiC, TaC, WN, WC, and/or HfN; conductive oxides such as RuOx and/or ReOx; metal-metal-alloys such as Ti—Al, Hf—Al, Ta—Al, and/or TaAlN; multi-stacked structures of the preceding compositions, such as TiN/W, TiN/Ti—Al, Ta/TiN/Ti—Al, or the like. According to an embodiment, one or more of the above compositions can be stacked with a Si and metal-silicide, such as $NiSi_x$, $PtSi_x$, $PdSi_x$, $CoSi_x$, $TiSi_x$, $WSi_x$, etc. It should be appreciated, however, that the preceding list is provided by way of example and that other compositions could be utilized for gate electrode 610.

According to another embodiment as illustrated by FIG. 6, La can be incorporated at least in the IL 606 of semiconductor device 600. In one example, La in IL 606 can be utilized to facilitate modulation of the threshold voltage $V_t$ of semiconductor device 600 via a negative shift of the threshold voltage of semiconductor device 600. Such modulation can, in one example, correspond to negative effective work function modulation. According to a further embodiment, the peak concentration of La in IL 606 can be approximately $10^{19}$ atoms/cm² to approximately $10^{22}$ atoms/cm².

While semiconductor device 600 illustrates a MOS transistor having La incorporated in the interfacial oxide layer, it should be appreciated that other implementations can be utilized. For example, La can be incorporated in the channel or high-k dielectric 608 of semiconductor device 600 in addition to or in place of IL 606. Further, other elements, such as Y, Mg, Lu, Gd, Ba, Ti, or the like, can be incorporated in addition to, or in place of, La. According to an embodiment, La (and/or one or more of the other elements listed above and/or any other suitable element(s)) can be utilized for high-$V_t$ pMOS in addition to, or in place of, the nMOS transistor shown in relation to semiconductor device 600. Further, while semiconductor device 600 illustrates a MOS transistor, it is to be appreciated that the embodiments described herein can also be applicable for novel channel devices (e.g., SiGe, SIC, SiGeC, III-V materials, etc.), novel device structures (e.g., Si on insulator (SOI), 3-dimensional transistors (e.g., finFET, verticalFET, nanowire, nanotube, . . . ), etc.), and/or any other suitable device type(s).

Figure 7:
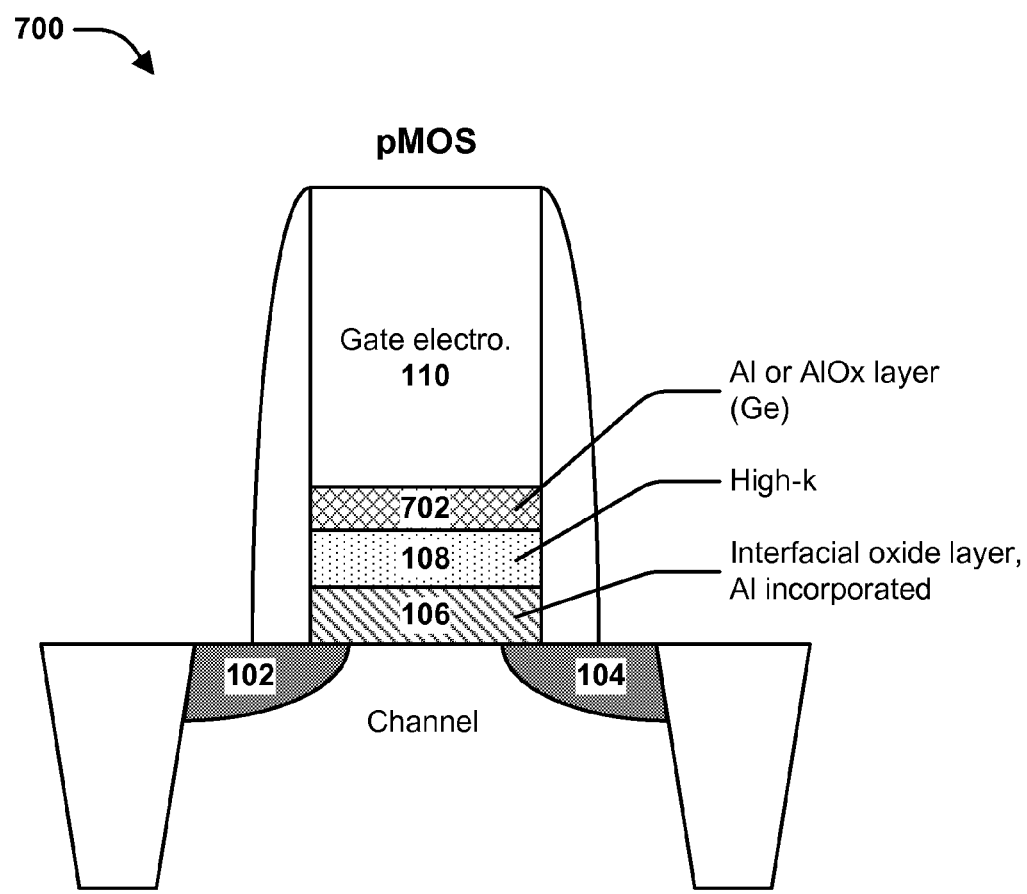

Referring next to FIG. 7, a cross-sectional illustration of another example semiconductor device 700 is provided in accordance with an embodiment. As shown by FIG. 7, semiconductor device 700 can include a pMOS transistor, which can be constructed using a source region 102, a drain region 104, an interfacial oxide layer 106, a high-k dielectric 108, and a gate electrode 110 in a similar manner to that described above in relation to semiconductor device 100. According to an embodiment, Al (and/or Ge or any other suitable element(s)) can be incorporated into at least IL 106 of semiconductor device 700, thereby facilitating enhanced threshold voltage modulation for semiconductor device 700 via positive threshold voltage shifting in a similar manner to that described above with respect to semiconductor device 100. According to another embodiment, semiconductor device 700 can additionally include a supplemental layer 702 of Al or $AlO_x$ (and/or Ge or $GeO_x$, or any other suitable element or metal-oxide) at the high-k/gate interface of semiconductor device 700. According to a further embodiment, supplemental layer 702 can exhibit a thickness between approximately 0.1 nm and approximately 3 nm.

Figure 8:
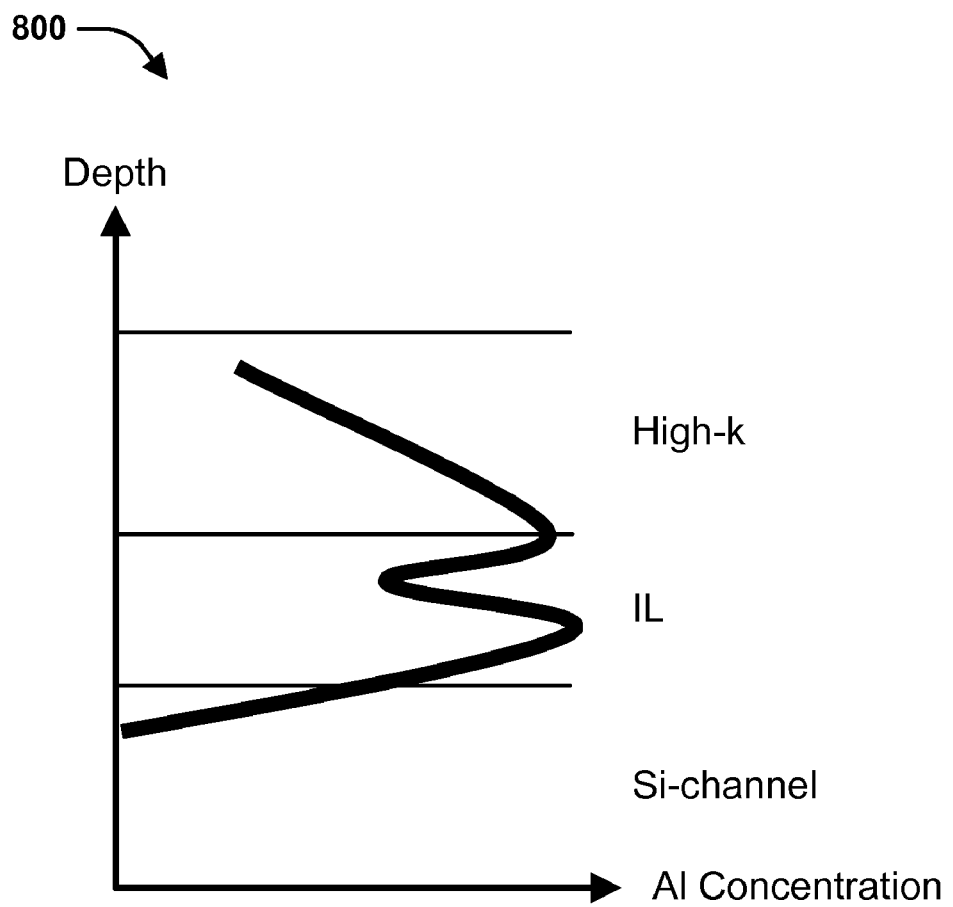
FIG. 8 illustrates a depth profile of an example transistor design in accordance with an embodiment of the subject innovation.

By incorporating a supplemental layer 702 at the high-k/gate interface of semiconductor device 700, it can be appreciated that the depth profile of the density of Al (or Ge) within semiconductor device 700 can be substantially similar to that illustrated by graph 800 in FIG. 8. As graph 800 illustrates, by incorporating one or more supplemental layers within the semiconductor device, more than one depth of peak density can exist. For example, a first depth of peak density can be below the high-k/IL interface due to dosing of one or more third elements as described with relation to semiconductor device 100, and a second depth of peak density can be above or at the high-k/IL interface due to incorporation of a supplemental layer as described with relation to semiconductor device 700.

Additionally or alternatively, although not shown in FIG. 7, a supplemental layer can be implemented at the high-k/IL interface of semiconductor device 700. By including one or more supplemental layers 702 into semiconductor device 700 in addition to dosing of at least IL 106 as described above, it can be appreciated that a $V_t$ shift that is larger than conventional techniques as well as the structure shown by FIG. 1 can be obtained.

Figure 9:
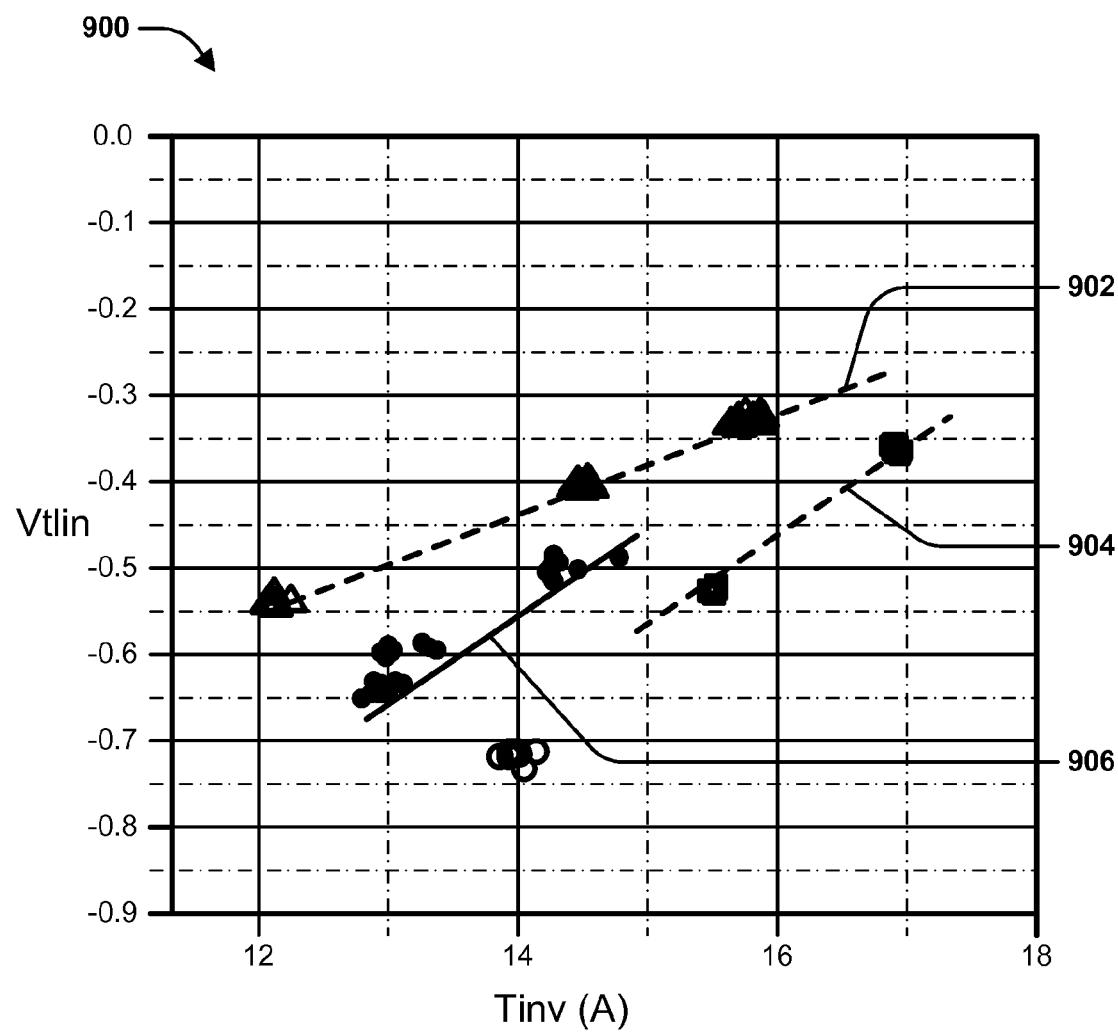
FIG. 9 illustrates further threshold voltage modulation data for respective example transistor designs in accordance with various embodiments of the subject innovation.

To illustrate the $V_t$ shift achievable by semiconductor device 700 in FIG. 7, graph 900 in FIG. 9 illustrates baseline threshold voltage data relating to various semiconductor device implementations as a function of gate dielectric thickness under inversion ($T_{inv}$). In particular, line 902 in graph 900 represents a semiconductor device for which both Al ion implantation in the IL and an Al layer on the high-k layer have been implemented, line 904 represents a semiconductor device for which only an Al layer on the high-k layer has been implemented, and line 906 represents a semiconductor device for which only Al ion implantation on the IL has been implemented. Further, the points below lines 902-906 represent a control device, for which neither Al ion implantation nor an Al layer have been implemented. Accordingly, as shown by graph 900, both the Al ion implantation technique and the Al layer technique yield a higher amount of threshold voltage modulation than the control case. As further shown by graph 900, the combination of the Al ion implantation technique and the Al layer technique yield a greater amount of threshold voltage modulation than either technique performed separately.

Figure 10:
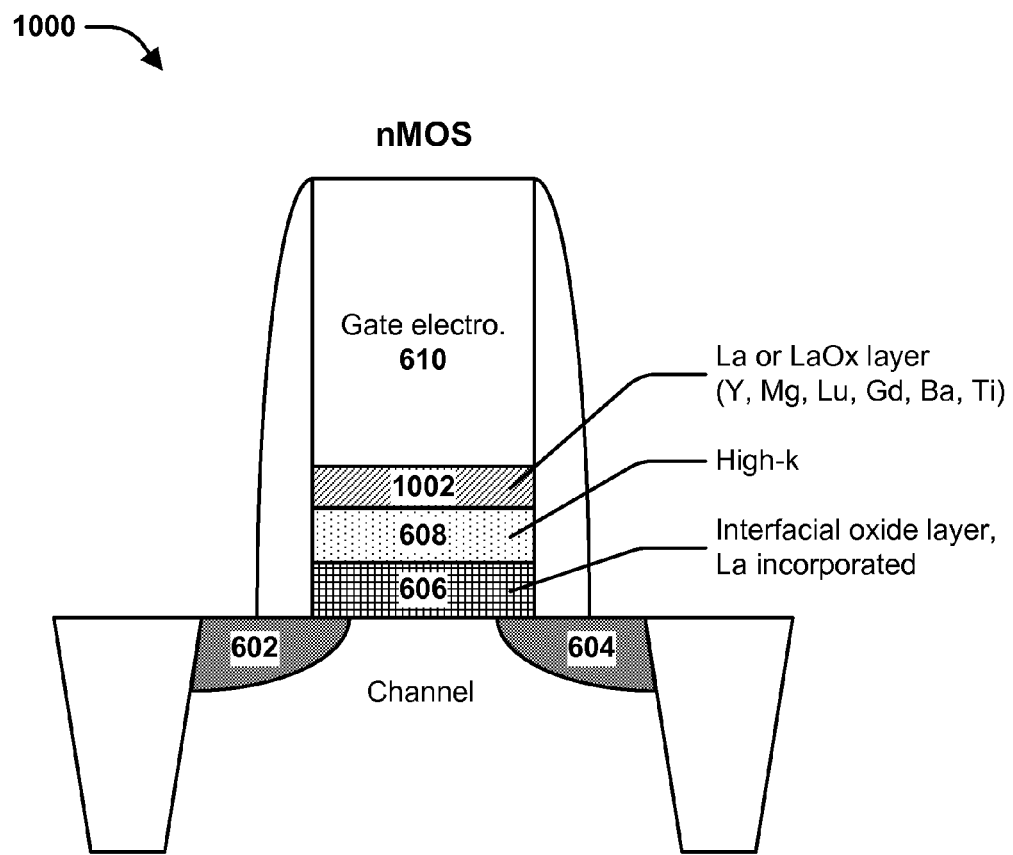
FIGS. 10 to 14 are further cross-sectional illustrations of portions of example MOSFETs in accordance with respective embodiments of the subject innovation.

Turning to FIG. 10, a cross-sectional illustration of yet another example semiconductor device 900 is provided in accordance with an embodiment. As shown by FIG. 10, semiconductor device 1000 can include an nMOS transistor, which can be constructed using a source region 602, a drain region 604, an interfacial oxide layer 606, a high-k dielectric 608, and a gate electrode 610 in a similar manner to that described above in relation to semiconductor device 600. Further, La (or Y, Mg, Lu, Gd, Ba, Ti, and/or any other suitable element(s)) can be incorporated into at least IL 606 of semiconductor device 1000, thereby facilitating enhanced threshold voltage modulation for semiconductor device 1000 via negative threshold voltage shifting in a similar manner to that described above with respect to semiconductor device 600. According to another embodiment, semiconductor device 900 can additionally include a supplemental layer 1002 of La or $LaO_x$ (and/or Y, Mg, Lu, Gd, Ba, Ti, any other suitable element(s), or any metal-oxide of such element(s)) at the high-k/gate interface of semiconductor device 1000. According to a further embodiment, supplemental layer 1002 can exhibit a thickness from approximately 0.1 nm to approximately 3 nm.

By incorporating a supplemental layer 1002 at the high-k/gate interface of semiconductor device 1000, it can be appreciated that more than one depth of peak density can exist, in a similar manner to that shown by graph 800 in relation to semiconductor device 700. For example, a first depth of peak density can be below the high-k/IL interface due to dosing of one or more third elements as described with relation to semiconductor device 600, and a second depth of peak density can be above or at the high-k/IL interface due to incorporation of a supplemental layer as described with relation to semiconductor device 1000.

Additionally or alternatively, although not shown in FIG. 10, a supplemental layer can be implemented at the high-k/IL interface of semiconductor device 1000. By including one or more supplemental layers 1002 into semiconductor device 1000 in addition to dosing of at least IL 606 as described above, it can be appreciated that a $V_t$ shift that is larger than conventional techniques as well as the structure shown by FIG. 6 can be obtained.

Figure 11:
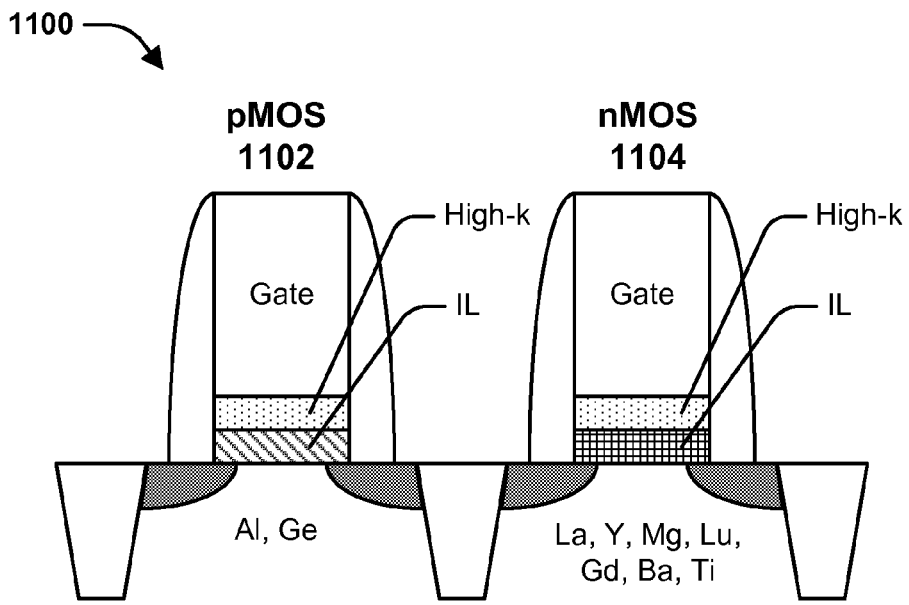

According to an embodiment, various semiconductor devices, such as semiconductor devices 100, 600, 700, and/or 1000 or any other suitable semiconductor device(s), can be combined in various manners to form additional device structures. Examples of such device structures that can be formed based on respective semiconductor devices as described herein are illustrated by FIGS. 11 through 14. Referring first to FIG. 11, a CMOS semiconductor device 1100 is illustrated, which includes a pMOS transistor 1102 and an nMOS transistor 1104. According to an embodiment, pMOS transistor 1102 and nMOS transistor 1104 can have one or more third elements incorporated in at least their respective interfacial oxide layers, thereby facilitating enhanced threshold voltage modulation in a similar manner to semiconductor devices 100 and 600, respectively.

Figure 12:
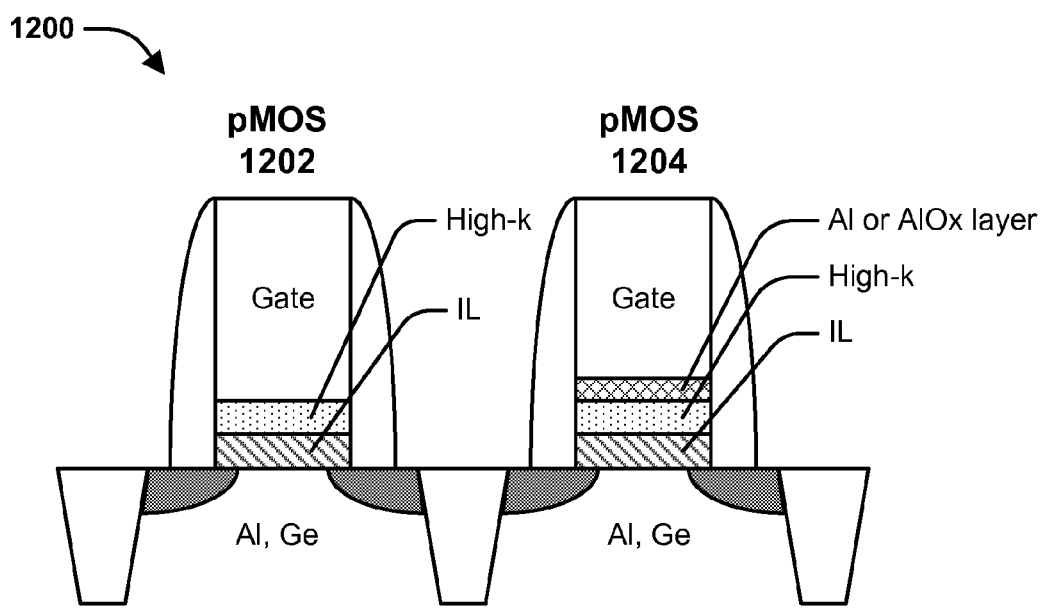

FIG. 12 illustrates an example multi-$V_t$ pMOS semiconductor device 1200 that can be utilized according to another embodiment, which can include a first pMOS transistor 1202 and a second pMOS transistor 1204. In one example, the pMOS transistors 1202 and 1204 can have at least one third element incorporated into at least their respective interfacial oxide layers, in a similar manner to that described above relating to pMOS transistor 1102 and semiconductor device 100. In addition, the second pMOS transistor 1204 can have a supplemental layer of Al, $AlO_x$, and/or any other suitable element(s) or metal-oxide(s) in a similar manner to semiconductor device 700, thereby facilitating threshold voltage modulation that is substantially higher than that of the first pMOS transistor 1202 and enabling the multi-$V_t$ operation of semiconductor device 1200.

Figure 13:
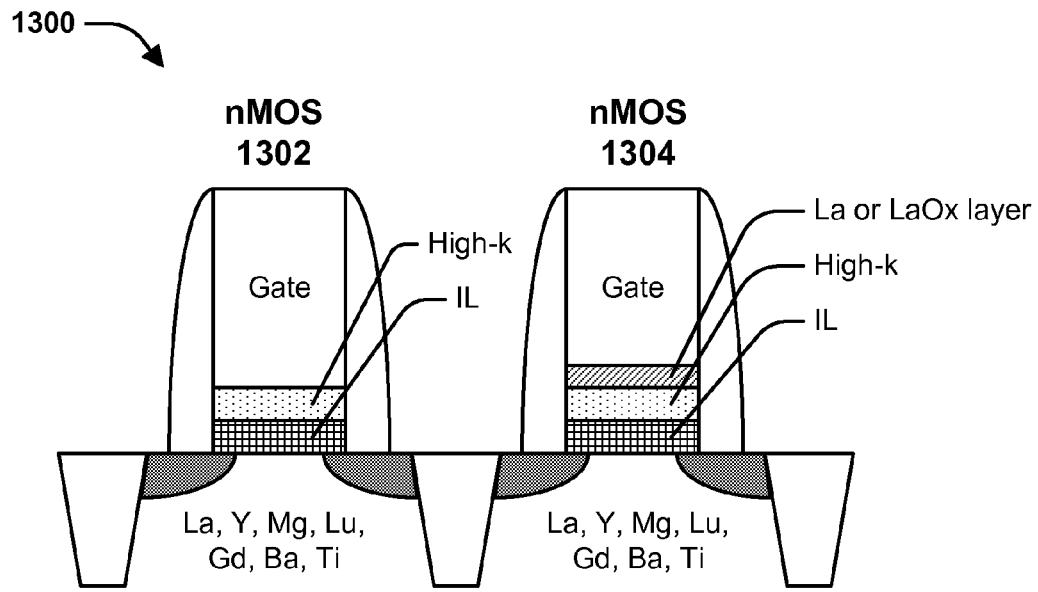

FIG. 13 illustrates an example multi-$V_t$ nMOS semiconductor device 1300 that can be utilized according to yet another embodiment, which can include a first nMOS transistor 1302 and a second nMOS transistor 1304. In one example, the nMOS transistors 1302 and 1304 can have at least one third element incorporated into at least their respective interfacial oxide layers, in a similar manner to that described above relating to nMOS transistor 1104 and semiconductor device 600. In addition, the second nMOS transistor 1304 can have a supplemental layer of La, $LaO_x$, and/or any other suitable element(s) or metal-oxide(s) in a similar manner to semiconductor device 1000, thereby facilitating threshold voltage modulation that is substantially higher than that of the first nMOS transistor 1302 and enabling the multi-$V_t$ operation of semiconductor device 1300.

Figure 14:
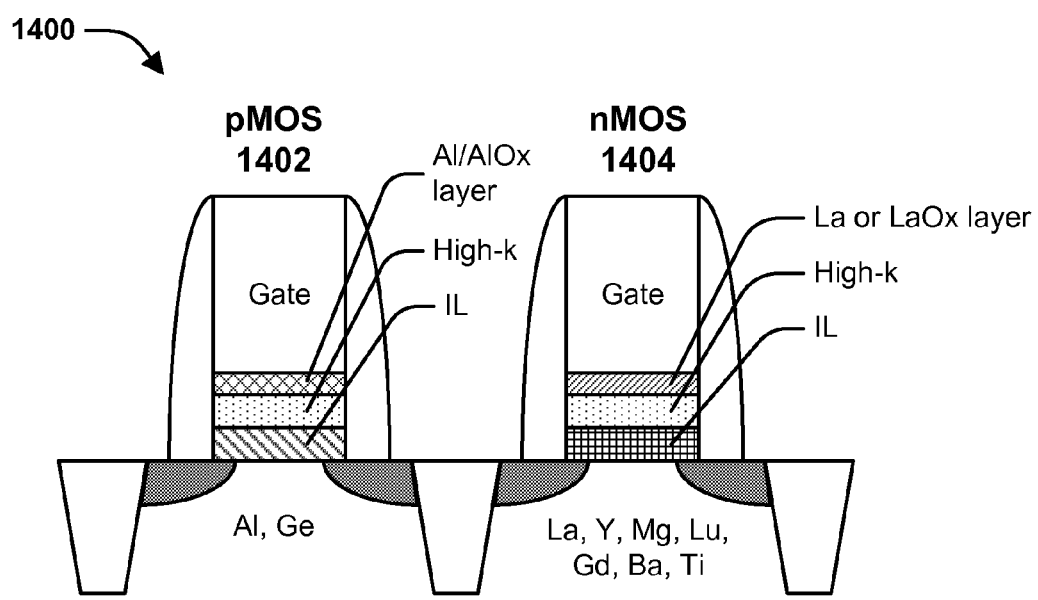

Referring next to FIG. 14, a second CMOS semiconductor device 1400 is illustrated according to an additional embodiment, which includes a pMOS transistor 1402 and an nMOS transistor 1404. According to an embodiment, pMOS transistor 1402 and nMOS transistor 1404 can have one or more third elements incorporated in at least their respective interfacial oxide layers, thereby facilitating enhanced threshold voltage modulation in a similar manner to semiconductor devices 100 and 600, respectively. Further, pMOS transistor 1402 and nMOS transistor 1404 can additionally include at least one supplemental metal or metal-oxide layer in a similar manner to semiconductor devices 700 and 1000, respectively, thereby facilitating a greater amount of threshold voltage modulation than that which can be achieved via ion implantation or the supplemental layers individually.

Turning next to FIGS. 15-18, various techniques for fabricating a semiconductor device according to at least the embodiments described above are presented. It should be appreciated, however, that the semiconductor devices described above can be created using any suitable process or combination of processes and that the following description is provided by way of non-limiting example. Further, it should be appreciated that the processes presented in the following description can be utilized to fabricate any suitable product(s) and are not intended to be limited to the semiconductor devices described above.

Figure 15:
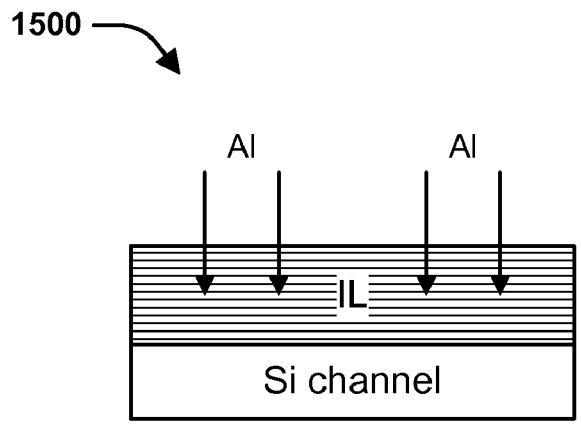
FIG. 15 illustrates a first example procedure for semiconductor device fabrication in accordance with an embodiment of the subject innovation.

With reference first to FIG. 15, a first example procedure for semiconductor device fabrication in accordance with an embodiment of the subject innovation is illustrated via a diagram 1500. As diagram 1500 illustrates, upon formation of the interfacial oxide layer, Al (or other suitable element(s)) can be incorporated into the interfacial oxide layer via various techniques such as ion implantation (e.g., at an energy of less than 10 keV and/or any other suitable energy level), plasma doping, low-temperature ion implantation, in which wafer temperature is decreased below room temperature during ion implantation process, and/or any other suitable techniques or combination of techniques for incorporating material into the interfacial oxide layer. In a specific, non-limiting example, the peak position of the element(s) doped into the semiconductor device during the incorporation step can be substantially greater than 1A from the surface of the semiconductor device at the time of the incorporation step (e.g., the surface of the interfacial oxide layer). Following incorporation of Al and/or other suitable materials into the interfacial oxide layer, the semiconductor fabrication process can continue via high-k deposition and/or any other suitable act(s). In one example, further annealing, gate formation, and/or any other suitable acts can occur following the high-k deposition. In another example, in the event that one or more supplemental layers (e.g., an $Al/AlO_x$ layer or other suitable layer as shown in FIG. 7, a $La/LaO_x$ layer or other suitable layer as shown in FIG. 10, etc.) is desired, formation of supplemental layer(s) can be conducted prior to and/or after high-k deposition in accordance with various techniques as generally known in the art.

Figure 16:
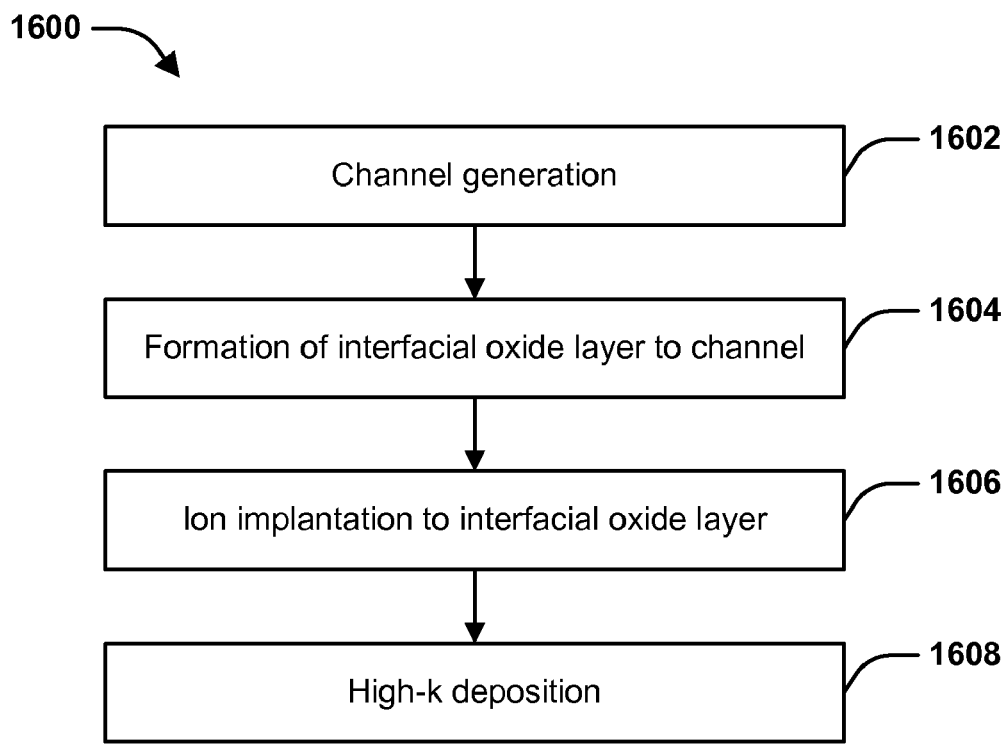
FIG. 16 is a flow diagram of a first example methodology for fabricating a semiconductor device in accordance with an embodiment of the subject innovation.

According to an embodiment, an example methodology for conducting at least partial fabrication of a semiconductor device is illustrated by flow diagram 1600 in FIG. 16. As flow diagram 1600 illustrates, an example semiconductor device fabrication methodology can include channel generation at 1602, followed by formation of an interfacial oxide layer to the channel at 1604 and ion implantation to the interfacial oxide layer at 1606. Following ion implantation, high-k deposition can be conducted at 1608.

Figure 17:
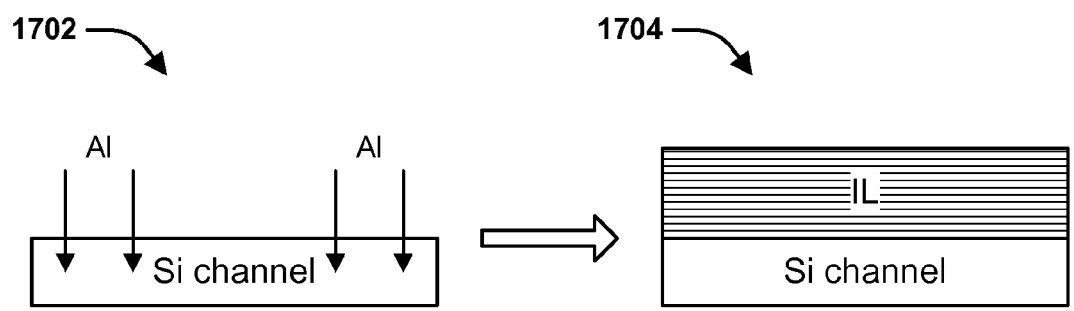
FIG. 17 illustrates a second example procedure for semiconductor device fabrication in accordance with an embodiment of the subject innovation.

Referring next to FIG. 17, a second example procedure for semiconductor device fabrication in accordance with an embodiment of the subject innovation is illustrated via diagrams 1702 and 1704. As initially illustrated by diagram 1702, Al (or other suitable element(s)) can be incorporated into the channel surface of a semiconductor device. Techniques that can be utilized for incorporation of third elements into the channel include, e.g., ion implantation (e.g., at an energy of less than 10 keV and/or any other suitable energy level), plasma doping, low-temperature ion implantation, and/or any other suitable techniques or combination of techniques for incorporating material. In a specific, non-limiting example, the peak position of the element(s) doped into the semiconductor device during the incorporation step can be substantially greater than 1A from the surface of the semiconductor device at the time of the incorporation step (e.g., the channel surface). In the case of Ge doping, dose range of $10^{13}$ to $3 \times 10^{15}$ ions/cm$^2$ and an energy range of less than 5 keV is prefer to obtain large Vt shift with maintaining good crystallinity of channel (high hole/electron mobility channel). Upon incorporation of one or more third elements into the channel, the interfacial oxide layer can be formed onto the channel, as shown by diagram 1704. Additionally, an Al segregation anneal (and/or annealing corresponding to any suitable material(s) incorporated into the channel) can be performed in connection with the interfacial oxide layer formation. Following formation of the interfacial oxide layer and annealing, the semiconductor fabrication process can continue via high-k deposition and/or any other suitable act(s). In one example, further annealing, gate formation, and/or any other suitable acts can occur following the high-k deposition. In another example, in the event that one or more supplemental layers (e.g., an Al/AlO$_x$ layer or other suitable layer as shown in FIG. 7, a La/LaO$_x$ layer or other suitable layer as shown in FIG. 10, etc.) is desired, formation of supplemental layer(s) can be conducted prior to and/or after high-k deposition in accordance with various techniques as generally known in the art.

Figure 18:
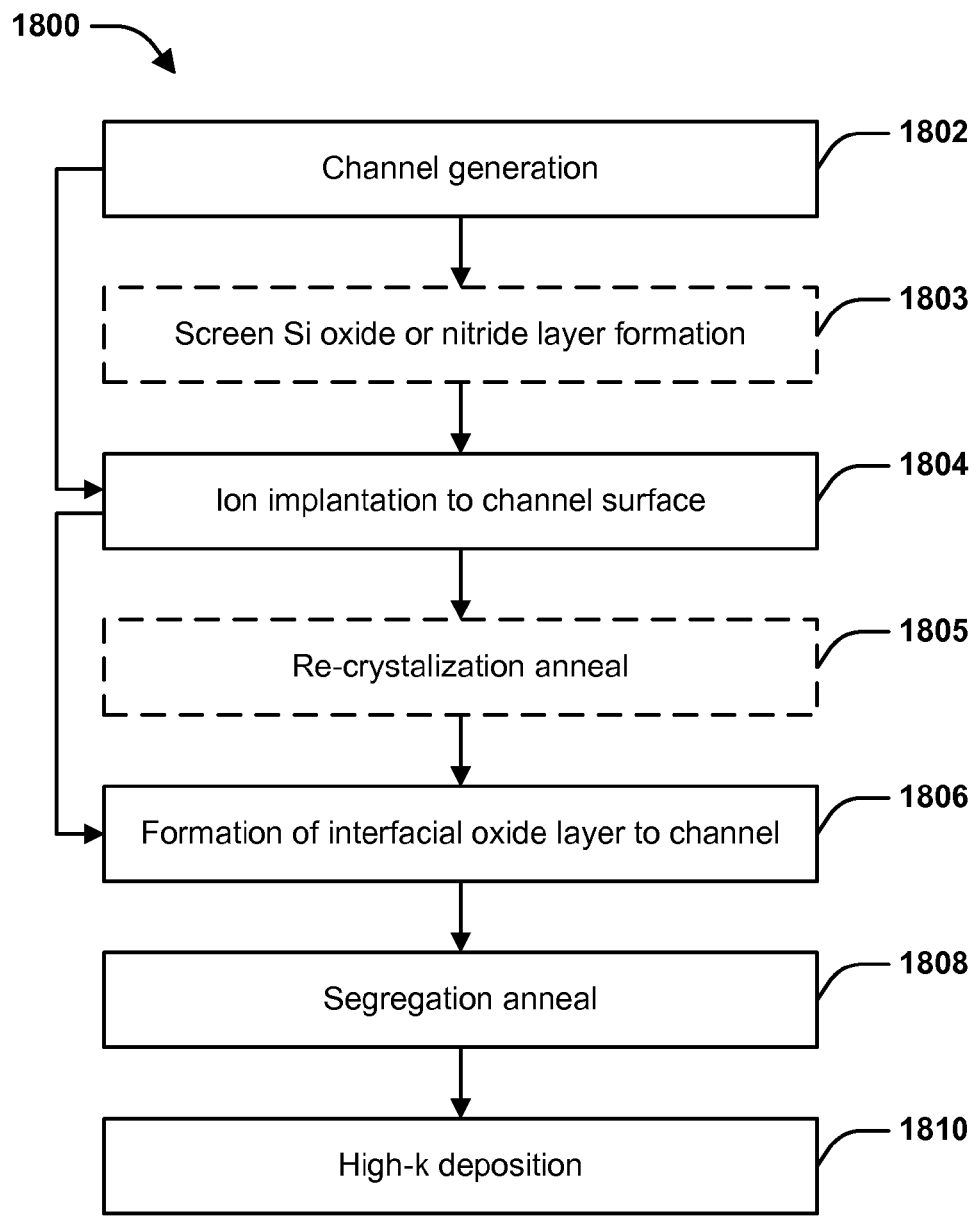
FIG. 18 is a flow diagram of a second example methodology for fabricating a semiconductor device in accordance with an embodiment of the subject innovation.

According to another embodiment, another example methodology for conducting at least partial fabrication of a semiconductor device is illustrated by flow diagram 1800 in FIG. 18. As flow diagram 1800 illustrates, an example semiconductor device fabrication methodology can include channel generation at 1802, followed by ion implantation to the channel surface at 1804. Formation of an interfacial oxide layer to the channel at 1806, and segregation annealing at 1808, can then occur. Following interfacial oxide layer formation and annealing, high-k deposition can be conducted at 1810.

According to a further embodiment, a screen layer of Si oxide or nitride can be formed at 1803 prior to ion implantation at 1804. Screen layer formation at 1803 can be performed, for example, to reduce physical damage in the channel during the ion implantation step, such as in the case of heavy ion implantation cases (e.g., Ge, La, etc.). In one example, a screen Si oxide or nitride thickness between approximately 1 nm and approximately 30 nm can be utilized to realize both a shallow depth profile and reduced channel damage.

According to an additional embodiment, a re-crystallization anneal can be performed at 1805 between ion implantation at 1804 and IL formation at 1806 to improve the crystallinity of the channel. Techniques that can be utilized for the re-crystallization anneal at 1805 can include, but are not limited to, furnace anneal, spike anneal, rapid thermal anneal (RTA), and millisecond anneal. By way of non-limiting example, in the case of RTA or spike anneal, the temperature range used for annealing can be between approximately 700° C. and 1300° C. And adding thin epitaxial Si, SiGe, SiC, or SiGeC layer at the top of the ion implanted layer after re-crystallization anneal is a effective way to improve the hole/electron mobility. The thin epitaxial later thickness at the range of 0.5 nm to 5 nm prefers to realize both large Vt shift and high carrier mobility.

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

Further, while certain embodiments have been described above, it is to be appreciated that these embodiments have been presented by way of example only, and are not intended to limit the scope of the claimed subject matter. Indeed, the novel methods and devices described herein may be made without departing from the spirit of the above description. The accompanying claims and their equivalents are intended to cover such forms or modifications as would fall within the scope and spirit of the subject innovation.

In addition, it should be appreciated that while the respective methodologies provided above are shown and described as a series of acts for purposes of simplicity, such methodologies are not limited by the order of acts, as some acts can, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

What is claimed is:

1. A semiconductor device, comprising:
   a substrate; and
   a Metal-Oxide-Semiconductor (MOS) transistor comprising:
      a semiconductor region formed on the substrate;
      a source region and drain region formed in the semiconductor region,
   wherein the source region and drain region are separated from each other;
      a channel region formed in the semiconductor region that separates the source region and the drain region;
      an interfacial oxide layer (IL) formed on the channel region having at least one element incorporated therein that is disparate from Si, O, or N at a peak concentration greater than $1 \times 10^{19}$ atoms/cm$^2$; and
      a high-k dielectric layer formed on the interfacial oxide layer having a high-k/IL interface at a depth substantially adjacent to the IL;
      wherein at least one depth of peak density of the at least one element is located substantially below the high-k/IL interface.

2. The semiconductor device of claim 1, wherein the at least one element comprises one or more of Al, Ge, La, Y, Mg, Lu, Gd, Ba, or Ti.

3. The semiconductor device of claim 1, wherein the MOS transistor is an n-channel MOS (nMOS) transistor.

4. The semiconductor device of claim 3, wherein the at least one element comprises one or more of La, Y, Mg, Lu, Gd, Ba, or Ti.

5. The semiconductor device of claim 1, wherein the MOS transistor is a p-channel MOS (pMOS) transistor.

6. The semiconductor device of claim 5, wherein the at least one element comprises one or more of Al or Ge.

7. A semiconductor device, comprising:
   a substrate; and
   a Metal-Oxide-Semiconductor (MOS) transistor comprising:
      a semiconductor region formed on the substrate;
      a source region and drain region formed in the semiconductor region,
   wherein the source region and drain region are separated from each other;

a channel region formed in the semiconductor region that separates the source region and the drain region;

an interfacial oxide layer (IL) formed on the channel region having at least one element incorporated therein that is disparate from Si, O, or N at a peak concentration greater than $1\times10^{19}$ atoms/cm$^2$;

a high-k dielectric layer formed on the interfacial oxide layer having a high-k/IL interface at a depth substantially adjacent to the IL; and a supplemental layer adjacent to the high-k dielectric layer that is substantially composed of the at least one element or at least one oxide of the at least one element;

wherein at least a first depth of peak density of the at least one element is located substantially below the high-k/IL interface and at least a second depth of peak density of the at least one element is located at a depth corresponding to the supplemental layer.

8. The semiconductor device of claim 7, wherein the supplemental layer is located at one or more of a depth corresponding to the high-k/IL interface or a depth located substantially above the high-k dielectric layer.

9. The semiconductor device of claim 7, wherein the at least one element comprises one or more of Al, Ge, La, Y, Mg, Lu, Gd, Ba, or Ti.

10. The semiconductor device of claim 7, wherein the MOS transistor is an n-channel MOS (nMOS) transistor.

11. The semiconductor device of claim 10, wherein the at least one element comprises one or more of La, Y, Mg, Lu, Gd, Ba, or Ti.

12. The semiconductor device of claim 7, wherein the MOS transistor is a p-channel MOS (pMOS) transistor.

13. The semiconductor device of claim 12, wherein the at least one element comprises one or more of Al or Ge.

\* \* \* \* \*